United States Patent [19]

Phillips

[11] Patent Number: 4,896,280

[45] Date of Patent: Jan. 23, 1990

[54] ELECTRONIC TAPE RULE

[75] Inventor: Gareth S. Phillips, Cambridgeshire, United Kingdom

[73] Assignee: The Stanley Works, New Britain, Conn.

[21] Appl. No.: 138,909

[22] PCT Filed: Mar. 24, 1987

[86] PCT No.: PCT/US87/00667

§ 371 Date: Nov. 19, 1987

§ 102(e) Date: Nov. 19, 1987

[87] PCT Pub. No.: WO87/05995

PCT Pub. Date: Oct. 8, 1987

[30] Foreign Application Priority Data

Mar. 27, 1986 [GB] United Kingdom ................. 8607746

[51] Int. Cl.⁴ .............................................. G01B 3/08
[52] U.S. Cl. ..................................... 364/562; 377/24; 33/759
[58] Field of Search ................................ 364/560–564, 364/709.01, 709.02, 709.03, 709.09, 709.11, 705.01; 33/125 R, 125 A, 137 R, 138, 139, 140, 755, 759, 760–763; 377/24

[56] References Cited

U.S. PATENT DOCUMENTS

| 4,161,781 | 7/1979 | Hildebrand | 33/140 X |
| 4,181,848 | 1/1980 | Iwase | 33/140 X |
| 4,181,959 | 1/1980 | Tateishi | 377/24 X |
| 4,195,348 | 3/1980 | Kakutani | 33/140 X |
| 4,233,749 | 11/1980 | Coulter et al. | 364/562 X |
| 4,242,574 | 12/1980 | Grant | 377/18 |
| 4,491,928 | 1/1985 | Reichl | 364/562 |
| 4,519,709 | 5/1985 | Nelle | 33/125 A X |
| 4,535,415 | 8/1985 | Hird | 364/562 |
| 4,551,847 | 11/1985 | Caldwell | 33/137 R |
| 4,575,944 | 3/1986 | Lin | 33/762 |
| 4,604,725 | 8/1986 | Davies | 364/200 |
| 4,628,201 | 12/1987 | Schmitt | 33/125 A X |
| 4,701,615 | 10/1987 | Schmitt | |
| 4,747,215 | 5/1988 | Waikas | 33/140 X |
| 4,779,211 | 10/1988 | March | 33/140 X |

FOREIGN PATENT DOCUMENTS

| 2415345 | 10/1974 | Fed. Rep. of Germany . | |
| 2826030 | 12/1978 | Fed. Rep. of Germany . | |
| 2938136 | 4/1981 | Fed. Rep. of Germany . | |
| 3326137 | 1/1985 | Fed. Rep. of Germany | 33/140 |
| 0056858 | 5/1979 | Japan | 33/140 |
| 0235009 | 11/1985 | Japan | 33/140 |
| 0054407 | 3/1986 | Japan | 33/140 |
| 1511044 | 5/1978 | United Kingdom . | |
| 2126444 | 3/1984 | United Kingdom . | |

Primary Examiner—Parshotam S. Lall
Assistant Examiner—Joseph L. Dixon
Attorney, Agent, or Firm—Chilton, Alix & Van Kirk

[57] ABSTRACT

An electronic tape rule comprising a housing (6), a tape (1) that may be extended from the housing and which carries a position track (3, 4) therealong, a reading system (30, 31) in the housing past which the position track travels during movement of the tape, a first processor (10) electrically connected to the reading system for receiving electrical signals therefrom and generating an output indicating the extent of extension of the tape, and a visual display (23) indicative of the extent of tape extension. A second processor (12) is electrically connected to the visual display and to the first processor. A key pad 21 specifies a choice of alternative preprogrammed calculations, the second processor being operative in a first operative state to pass a signal indicating the extent of real tape extension to the visual display and responsive to the key pad to operate in a second operative state in which subsequent signals indicative of the extent of current tape extensions are processed using an earlier extension value stored in memory and the processed result is passed to the visual display.

10 Claims, 3 Drawing Sheets

ELECTRONIC TAPE RULE

This invention relates to a tape rule.

BACKGROUND

The provision of an electronic tape rule in which a digital readout of tape position is combined with an ability to perform calculation using tape position as an input is described in Japanese Utility Model No. SHO 51-71937, U.S. Pat. Nos. 4161781 (Hildebrandt), 4181959 (Tateishi), 4181960 (Tateishi et al.), 4316081 (Washizuka) and UK Patent Specifications Nos. 2102121 (Souic Tapei) and 2052745 (Wines). However the above references require the user to carry out two key operations to display the result of a calculation based on a previous tape position and do not provide for updating the result continuously based on current tape position.

SUMMARY OF THE INVENTION

In one aspect the invention provides a tape rule comprising a tape that may be extended from a housing and that carries a position track therealong, reading means in the housing past which the position track travels during movement of the tape, first processor means electrically connected to the reading means for receiving electrical signals therefrom and generating an output state indicating an extension of the tape, visual readout means for providing a visual display of tape extension and second processor means electrically connected to the visual readout means and to the first processor means for communication of the output state and arranged in a first operative state to pass a signal significant of real tape extension to the visual readout means and responsive to selector means to pass to a second operative state in which subsequent real tape extensions are operated on using an earlier extension value stored in memory and a result is passed to the visual readout means.

The ability to execute arithmetical calculations in real time depending upon a current position of the tape enables a "tab" function to be provided in which a flag portion of the display is illuminated when the tape has been pulled out a distance which is at or close to a multiple of a previous distance.

In a further aspect the invention provides a tape rule comprising a tape that may be extended from a housing and that carries a position track therealong, reading means in the housing past which the position track travels during movement of the tape, first processor means electrically connected to the reading means for receiving electrical signals therefrom and generating an output state indicating an extension of the tape, visual readout means, and second processor means electrically connected to the visual readout means and to the first processor means for communication of the output state and arranged to respond to operation of selector means to store a then existing real tape extension in memory and subsequently to determine whether a subsequent real tape extension differs from an integer times the stored tape extension by no more than a predetermined permissible distance, and to indicate the existence of such a relationship on the visual readout means.

In a yet further function which is preferably included, on actuation of further selector means second processor means divides the real tape extension by two and outputs the result to the visual readout means.

In a yet further aspect the invention provides a tape rule comprising a tape that may be extended from a housing and that carries a position track therealong, reading means in the housing past which the position track travels during movement of the tape and processor means electrically connected to the reading means for receiving electrical signals therefrom and generating an output stage indicating an extension of the tape and visual readout means for providing a visual display of tape extension in accordance with the output state, wherein a datum position is provided on a side of the housing from which the tape extends and either the processor means corrects the information read from the tape when generating the output state by allowing for an offset between the sensors and the datum position or the effective start of the position track is offset from the start of the tape.

BRIEF DESCRIPTION OF THE DRAWINGS

An embodiment of the invention will now be described by way of example only, with reference to the accompanying drawings, in which.

DESCRIPTION OF A PREFERRED EMBODIMENT

Figure 1:
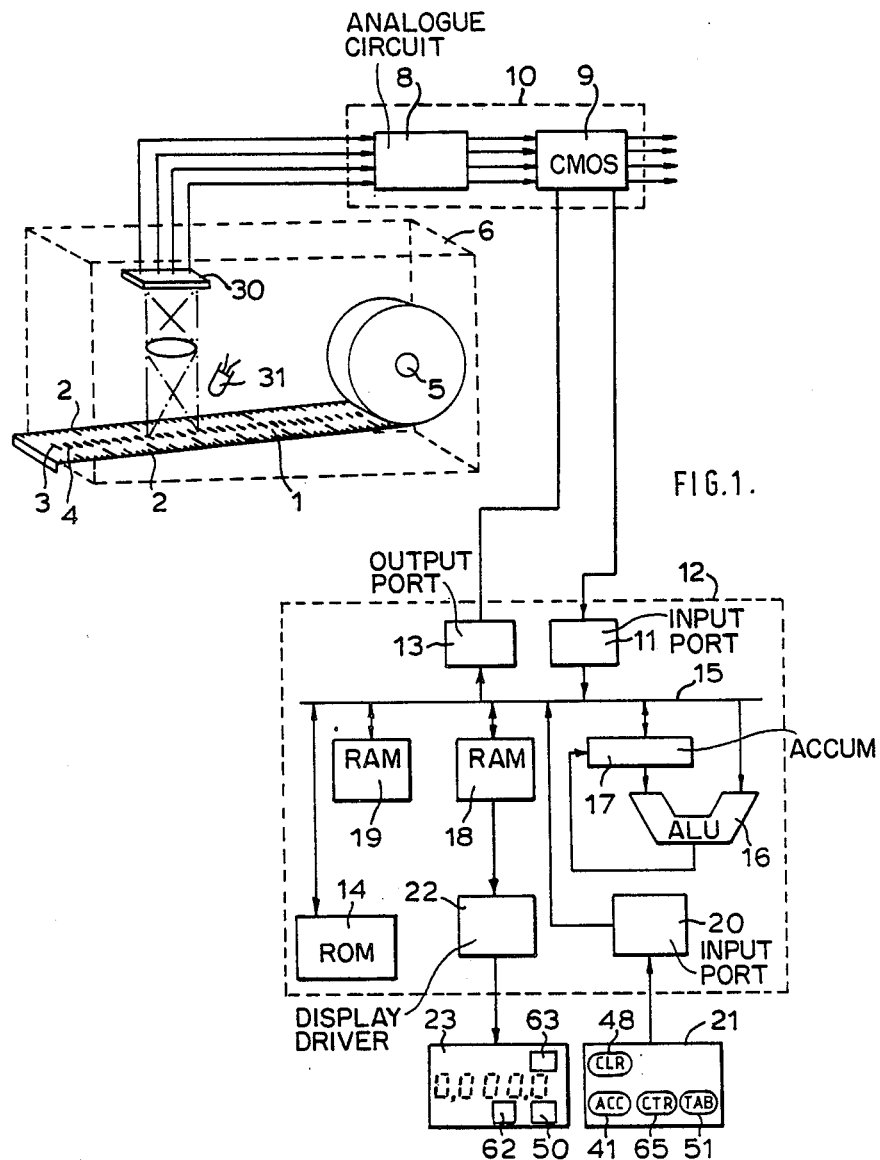
FIG. 1 is a block diagram of a tape rule according to the invention.

In the drawings, there is shown a steel tape rule that incorporates an electronic system that can give a digital reading of length, measured in either metric or imperial units. In use the tape operates in a similar manner to a conventional steel rule but can include additional features to assist the user, for example, automatic correction of reading for reveal measurement, taking the tape body width into account.

The proposed measurement method is described below in conjunction with FIG. 1. A tape 1 of steel or other inextensible material is used as in a conventional tape rule controlled by a tensator spring 5 but is printed with a pair of spatial encoder tracks 3, 4 in addition to the usual visually readable distance scales 2. Internal to a casing 6 of the product, the tape 1 is illuminated by means of a light-emitting diode 31 and an image of the encoder tracks 3, 4 is formed using a lens 7 on a photosensor array 30 which is arranged to have four sensitive areas in grouped pairs corresponding to the paired encoder tracks 3, 4. Each sensitive area views a small part of its encoder track. The pairs of sensors in array 30 are aligned with the tracks 3, 4 which are defined by mark and space or black and white areas of varying widths, printed on the tape 1 and imaged at the photosensors. Movement of the tape 1 causes the light level at each photosensor to vary as the area of the tape 1 corresponding to an individual photosensitive area changes between black and white. By suitable analogue processing, four binary signals, one for each photosensitive area are derived from the photosensor outputs. The two states of the signals represent black or white at the areas on the tape 1 corresponding to each of the photosensors. Movement of the tape 1 causes the binary signals to change as the encoder tracks 3, 4 move past the photosensor 30.

The pattern of the encoder tracks 3, 4 and the spacing of the photosensors 30 are arranged so that for every position on the tape 1, incremental movement of the tape 1 cause only one of the outputs to change state at a time. Sequences of states fulfilling this criterion are known as Gray codes. Additionally, it can be arranged that the direction of movement can, at all times, be deduced from the change in output states. The sequences of states produced by sensing the markings preferably define one or other of alternate paths that may be recognized by a local state decoder as a logical 1 or a logical 0 element of an m-sequence of pseudo-random elements of absolute position code (APC) laid down along the tape, the sequence having the "window" property that any group of m successive elements occurs once only in the sequence. Thus a recognised group of m APC elements defines a unique position on the tape, as described and claimed in our British application No. 8529360 filed 28 Nov. 1985. An advantage of using such an absolute position code is that damage to part of the tape does not bring about inutility of the whole tape beyond the damaged region.

As is apparent from FIG. 1, the output of sensor array 30 is fed to an analogue processing circuit 8 and then to CMOS digital processing logic 9 which are implemented in a single application-specified integrated circuit (ASIC) 10 that provides position data at input port 11 of a 4-bit CMOS mask-programmed microprocessor 12 and receives information and commands through an output port 13. The digital processing logic 9 of the ASIC 10 includes a local state decoder and an APC binary sequence decoder that are both implemented as hard wired logic and hence can run much more rapidly than the microprocessor 12 so that the code tracks 3, 4 can be followed even during rapid tape movement. The architecture of the microprocessor 12 is similar to a conventional calculator-type microprocessor and the ports 11, 13 communicate via a 4-bit bus 15 with an ALU 16, accumulator 17, display RAM 18 an general purpose RAM 19 which may be of 2–4K. size, under the control of firmware ROM 14. A keypad 21 communicates with the bus 15 through input port 20 that may read up to 12 keys. The output value to be displayed is fed from display RAM 18 toi a display driver 22 that may conveniently drive a display of up to 64 segments and is shown on a liquid crystal display 23.

Figure 4:
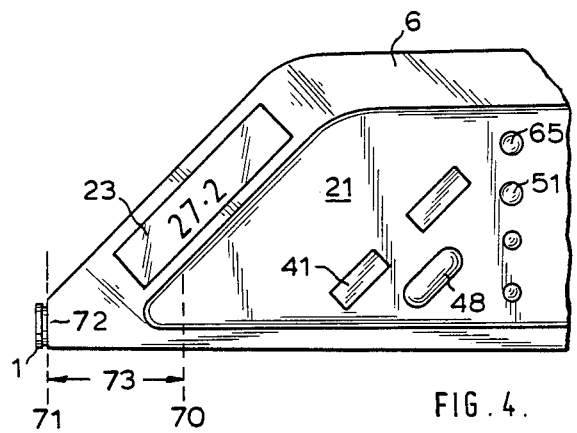
FIG. 4 is a diagrammatic side view of a casing of a tape rule according to the invention.

Referring to FIG. 4, the working position 70 of optical sensor 30 is inevitably located behind a datum position 71 defined by a flat front face 72 of the casing 6 from which the tape 1 is withdrawn or a cursor piece in front of the casing, from which measurement is to be made. In determining the value to be displayed the microprocessor 12 must allow for this offset 73 in normal measurement mode, as it would do in an alternative "case include" mode. It is particularly important to do so when the tape carries an absolute position code. Alternatively the start of the encoder tracks 3, 4 may be offset from the start of distance scales 2 by a distance corresponding to offset 73.

Figure 2:
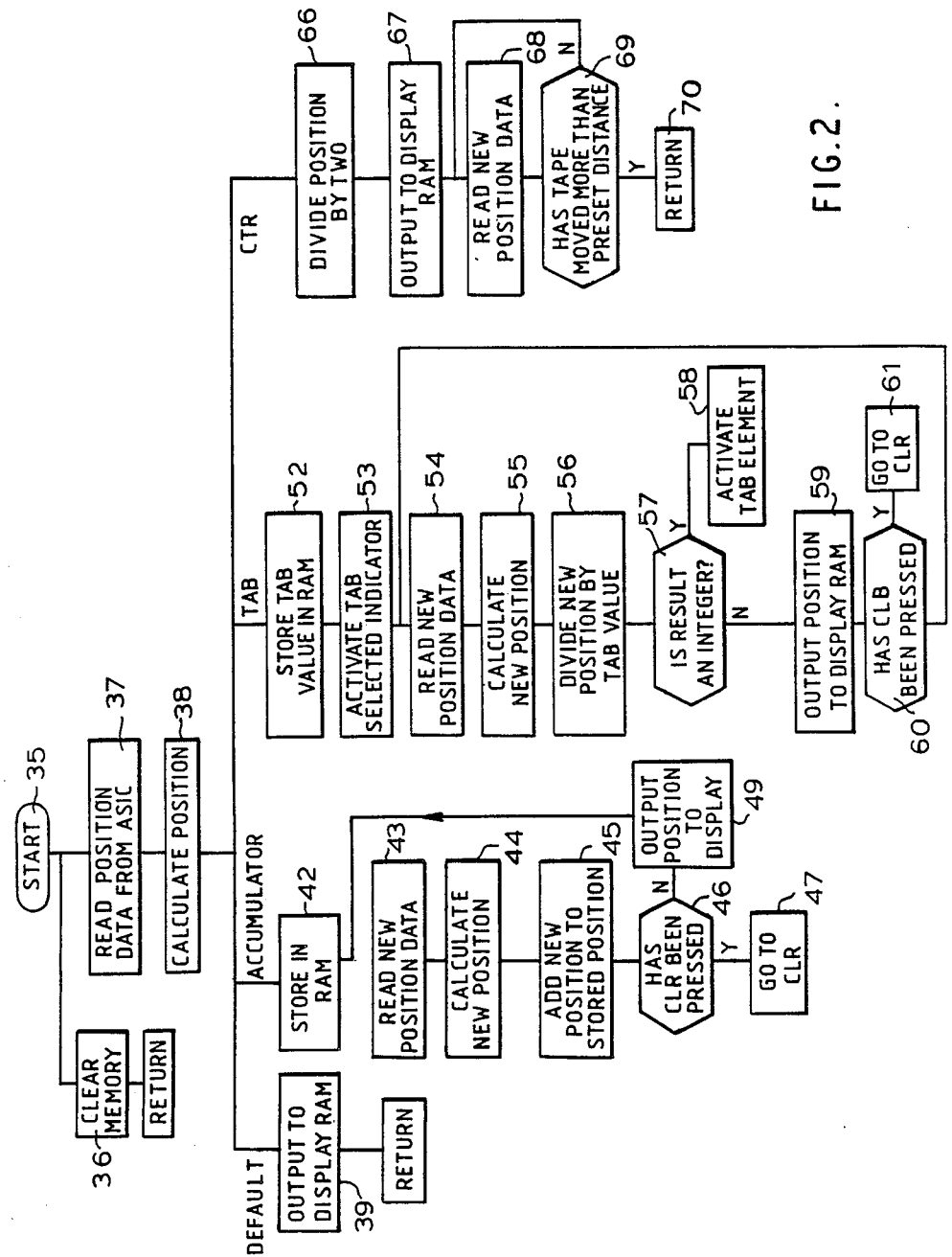
FIG. 2 is a flowchart illustrating routines held as firmware in a microprocessor forming part of the tape rule of FIG. 1.

Referring to FIG. 2, the firmware in ROM 14 will from a start-up state 35 clear stored data from RAM 19 at step 36 and then return. It then reads data significant of current tape position at 37, calculates a tape position in imperial or metric units to be displayed on display 23 at step 38, taking account of the offset 73 between the sensor position and the datum position at the front of the casing 6 and in a normal operation or default mode outputs at step 39 that position to display RAM 18 and returns.

The invention provides a continuous summation mode which supports length measurement where the length to be measured is greater than the length of the tape. On entering the summation mode, the display 23 shows the current tape extension which will have been loaded into RAM 18 at step 39 of the default mode. The value in RAM 18 is maintained until either a predetermined time has passed or until new tape position data determined by the ASIC chip 10 differs by a predetermined amount from the value when key 41 has been pressed. Pressing the summation key 41 causes a value significant of tape extension to be stored in RAM 19 at step 42 after which new position data from the ASIC 10 is read at 43. A tape position is calculated at step 44 as the sum of the new position from the ASIC and the extension value stored in RAM 19, a check is made at step 46 whether a clear key 48 has been pressed, and assuming that this has not happened the accumulator sub-routine outputs at 49 the result to display RAM 18 and returns to step 43. The stored value in the relevant register of RAM 19 will have been set to 0 at switch-on and at each subsequent actuation of summation key 41 the contents of that register will be incremented with the extension value obtained from ASIC 10 so that a cumulative sum of several measurements is obtained including the current tape position as latest measurement, which sum is displayed on display 23. On passing the CLR key 48 the firmware brings about a return to step 36 and the value in RAM 19 is cleared, after which the machine returns to the default mode.

Figure 3:
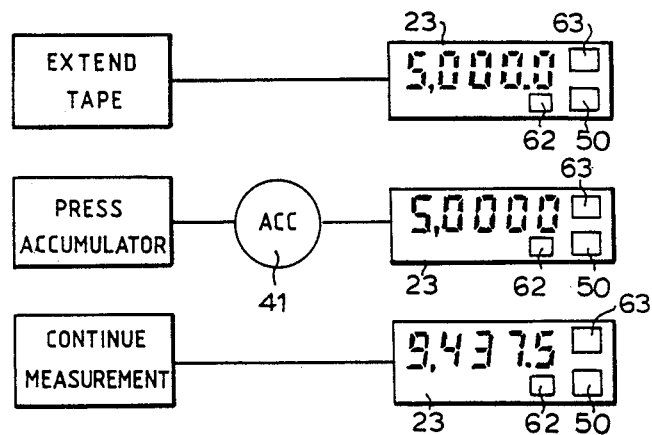
FIG. 3 is a diagram illustrating successive states of a display forming part of the tape rule of FIG. 1.

The effect on the display 23 is illustrated diagrammatically in FIG. 3. At the top line the tape rule is operating in default mode and the display 23 shows current tape position. At the second line, key 41 has been pressed, the value on display 23 is frozen and an indicator area 50 of the display is active. At line 3 the tape has been returned from an initial 5 meter extension to an extension of 4.437 meters, this movement exceeding a predetermined distance that the tape has to travel before display RAM 18 is freed. The sum of the stored and real tape extension values is now placed in RAM 18 at step 49 and the display reads 9.437 meters.

A further key 51 causes the firmware in ROM 14 to cause the microprocessor 12 to operate in a TAB mode. The tape extension calculated at step 38 is loaded at step 52 into RAM 19, and subsequent operations of key 51 will cause the previous value to be cleared and a new value to be entered. A tab selected indicator 62 of the display 23 is then activated at step 53. The microprocessor 12 then enters a routine where data is read from ASIC chip 10 at step 54, a current tape extension is calculated at step 55 and the current extension is divided at step 56 by the stored extension. If the result is an integer or differs from an integer by no more than defined limits when tested at step 57, a tab indicator 63 of display 23 is activated at step 58, and the position is output at step 59. The microprocessor checks at 60 whether clear key 48 has been pressed and assuming that this is not the case returns to step 54. The result is that tape extension is continuously shown on the display 23 and the tab indicator 63 is activated whenever the extension is a multiple of a stored tab value, so that it is easy e.g. to mark a wall at 0.15 meter intervals for attachment of battens at that spacing. On depression of CLR key 48 the firmware returns at 61 to step 36 and clears the relevant part of RAM 19, and indicator 62 is deactivated.

The accumulator and tab routines are preferably not mutually exclusive but may be run concurrently by the firmware in ROM 14.

A yet further mode of operation of microprocessor 12 provides a "centre"function. On depression of key 65 the current position value is halved at step 66 and the result is output at 67 to display RAM 18. The firmware continues to monitor tape position 68 and maintains the value in RAM 18 and on display 23 until the tape has moved a preset distance 69, after which the firmware returns to step 37.

I claim:

1. A tape rule comprising a housing, a tape that may be extended from the housing and which carries a position track therealong, reading means in the housing past which the position track travels during movement of the tape, first processor means electrically connected to the reading means for receiving electrical signals therefrom and generating an output indicating the extent of extension of the tape, visual readout means for providing a visual display indicative of the extent of tape extension, second processor means electrically connected to the visual readout means and to the first processor means, and selection means for specifying a choice of alternative preprogrammed calculations, said second processor means being operative in a first operative state to pass a signal indicating the extent of real tape extension to the visual readout means and responsive to said selector means to operate in a second operative state in which subsequent signals indicative of the extent of current tape extensions are processed using an earlier extension value stored in memory and a continuously processed result is passed to the visual readout means.

2. A tape rule according to claim 1, wherein in the second operative state the output of the first processor indicative of an earlier extension value is stored in memory; and said output is incremented by the then existing signals indicative of the extent of current tape extension value; and the sum thereof is passed to the visual readout means.

3. A tape rule according to claim 1 wherein the position track is encoded to define absolute positions along the tape, and the position track is formed by markings defining an m-sequence in which groups of m elements occur once, and the first processor means determines the tape extension by gathering values corresponding to m successive elements and determining their position in the sequence.

4. A tape rule according to claim 1, wherein the first processor means employs hard wired logic to generate the output and wherein the second processor means is a microprocessor having firmware instructions defining said operative states.

5. A tape rule according to claim 1 wherein a datum position is provided on a side of the housing from which the tape extends and either the processor means corrects the information read from the tape when generating the output state by allowing for an offset between the sensors and the datum position or the start of the position track is offset from the start of the tape.

6. A tape rule comprising a housing, a tape that may be extended from the housing and which carries a position track therealong, reading means in the housing past which the position track travels during movement of the tape, first processor means electrically connected to the reading means for receiving electrical signals therefrom and generating an output state indicating the extent to which the tape has been extended, visual readout means, second processor means electrically connected to the visual readout means and selector means, said second processor means also being electrically connected to the first processor means for communication of the output state and arranged to respond to operation of the selector means to store a then existing real tape extension in memory and subsequently to determine whether a subsequent real tape extension differs from an integer times the stored tape extension by no more than a predetermined permissible distance, and to indicate the existence of such a relationship on the visual readout means.

7. A tape rule accoridng to claim 6, wherein the second processor means sends a signal signifying real tape extension to the visual readout means.

8. A tape rule according to claim 6, wherein upon a further actuation of the selector means, the second processor means divides the real tape extension value by two and outputs the result to the visual readout means.

9. A tape rule according to claim 6, wherein, upon actuation of the selector means, the second processor means maintains a current extension value sent to the visual readout means until the second processor means has determined that the tape has been displaced by at least a predetermined interval from that extension.

10. A tape rule according to claim 9 wherein the position track is encoded to define absolute position along the tape.

* * * * *